United States Patent
Liu

(10) Patent No.: US 8,258,806 B2
(45) Date of Patent: Sep. 4, 2012

(54) SELF-ISOLATING MIXED DESIGN-RULE INTEGRATED YIELD MONITOR

(75) Inventor: Jin Liu, Southlake, TX (US)

(73) Assignee: Texas Instruments Incorporated, Dallas, TX (US)

( * ) Notice: Subject to any disclaimer, the term of this patent is extended or adjusted under 35 U.S.C. 154(b) by 780 days.

(21) Appl. No.: 12/340,155

(22) Filed: Dec. 19, 2008

(65) Prior Publication Data

US 2009/0160466 A1  Jun. 25, 2009

Related U.S. Application Data

(60) Provisional application No. 61/016,534, filed on Dec. 24, 2007.

(51) Int. Cl.
*G01R 31/02* (2006.01)

(52) U.S. Cl. .................................. 324/762.02

(58) Field of Classification Search .................. None
See application file for complete search history.

(56) References Cited

U.S. PATENT DOCUMENTS

| | | | | |
|---|---|---|---|---|
| 3,762,037 A | * | 10/1973 | Baker et al. ..................... | 438/6 |
| 3,922,707 A | * | 11/1975 | Freed et al. ..................... | 257/536 |
| 4,347,479 A | * | 8/1982 | Cullet ............................ | 324/716 |
| 6,426,516 B1 | * | 7/2002 | Sloman .......................... | 257/48 |
| 6,633,174 B1 | * | 10/2003 | Satya et al. ............. | 324/754.22 |
| 7,217,579 B2 | * | 5/2007 | Ben-Porath et al. ........... | 438/11 |

* cited by examiner

*Primary Examiner* — Paresh Patel

(74) *Attorney, Agent, or Firm* — Warren L. Franz; Wade J. Brady, III; Frederick J. Telecky, Jr.

(57) ABSTRACT

Assessing open circuit and short circuit defect levels in circuits implemented in state of the art ICs is difficult when using conventional test circuits, which are designed to assess continuity and isolation performance of simple structures based on individual design rules. Including circuit blocks from ICs in test circuits provides a more accurate assessment of defect levels expected in ICs using the circuit blocks. Open circuit defect levels may be assessed using continuity chains formed by serially linking continuity paths in the circuit blocks. Short circuit defect levels may be assessed by using parallel isolation test structures formed by linking isolated conductive elements in parallel to buses. Forming isolation connections on a high metal level enables location of shorted elements using voltage contrast on partially deprocessed or partially fabricated test circuits.

5 Claims, 11 Drawing Sheets

SELF-ISOLATING MIXED DESIGN-RULE INTEGRATED YIELD MONITOR

FIELD OF THE INVENTION

The instant invention relates to the field of integrated circuits. More particularly, the instant invention relates to test structures related to integrated circuits.

BACKGROUND OF THE INVENTION

Integrated circuits (ICs) include components such as transistors, diodes, and resistors, fabricated in surface layers of semiconductor substrates. These components are connected by metal interconnects fabricated in layers above the substrates to form electronic circuits. Feature sizes of some components in state of the art ICs are less than 100 nanometers. It is common to fabricate ICs with several million transistors. Current ICs often include circuit blocks which are utilized in a plurality of IC designs.

Many ICs are designed using rules for placing and sizing interconnect features, such as width of metal lines and spaces between lines. Defects may occur during IC fabrication that cause electrical shorts between metal lines in close proximity that should be electrically isolated, or open circuits in metal lines that should be continuous. Practitioners of IC fabrication attempt to assess a level of defects for interconnects that are fabricated in a particular facility or facilities and designed using a particular set or sets of design rules. In addition, practitioners of IC fabrication attempt to identify design features that may be prone to short circuits or open circuits in high volume production. A common approach is to design a set of test circuits that reproduce various features of interest thousands or millions times in a test circuit, such that one defect among the placements of a given feature is detectable during electrical testing of the test circuits. Knowledge of defect levels for various features of interest and of features prone to short circuits or open circuits is often used by practitioners of IC fabrication to improve fabrication processes or design rules, or both.

A major shortcoming in commonly used approaches to assessing defect levels is that features in interconnect test circuits often fail to mimic features found in actual interconnects of commercial ICs. There are several phenomena behind this failure. Firstly, interconnects in commercial ICs include a multitude of configurations that defy characterization using basic structures such as line and space networks. Secondly, photolithographic processes that define interconnect patterns often generate unexpected artifacts in photoresist patterns of minimum sized features, making it difficult to design test circuits that evaluate worst case elements. Further, photolithographic processes often interact with existing interconnect levels in ICs in unpredictable ways, causing interconnect features in ICs to be formed differently than similarly designed features in test circuits which lack identical existing interconnect levels. Also, deposition and etching processes that form interconnect features are sensitive to loading effects, in that formed dimensions of an individual feature are functions not only of a photolithographic pattern of such feature, but also of average density of features in a vicinity of such feature. Loading effects of IC components are difficult to reproduce in interconnect test circuits. Lastly, designs of interconnect test circuits frequently do not provide useful information regarding physical locations of defects, which impedes efforts to isolate and analyze defect mechanisms for purposes of improving fabrication processes or design rules, or both.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention addresses the problem of assessing open circuit and short circuit defect levels in integrated circuits (ICs). A test circuit includes multiple instances of a circuit block from an IC. Continuity paths in the circuit block are connected serially by added interconnect links to form one or more continuity chains. Elements in the circuit block which are designed to be isolated from elements in the continuity chain are connected in parallel to one or more parallel isolation buses by added interconnect links. Forming the interconnect links between isolated conductive elements and the parallel isolation buses on a higher metal level than all other elements enables identification of circuit blocks with short circuit defects among the placements of all the circuit blocks by use of voltage contrast analysis on partially fabricated and partially deprocessed test circuits.

DETAILED DESCRIPTION

Figure 1C:
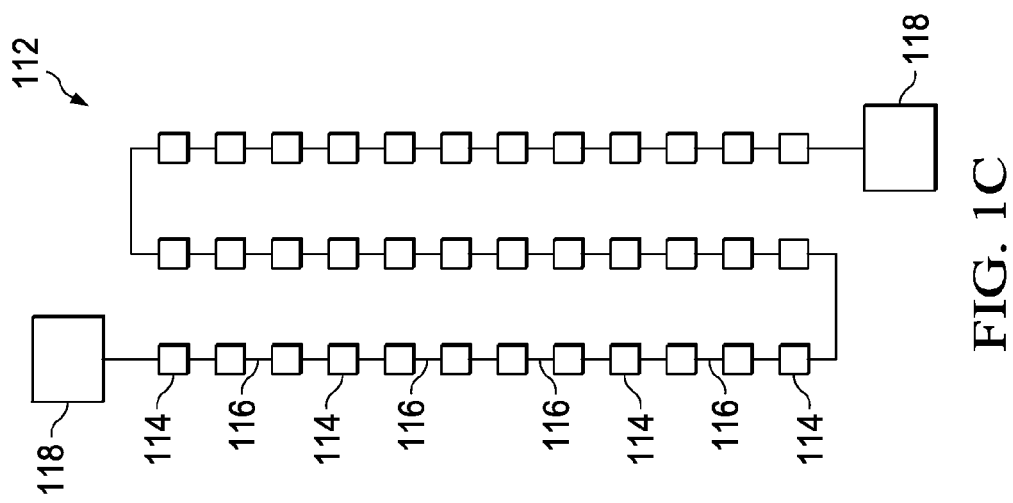
FIGS. 1A though 1C illustrate a depiction of the process of generating a test circuit embodying the instant invention.
Figure 1B:
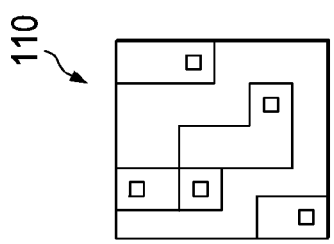
Figure 1A:
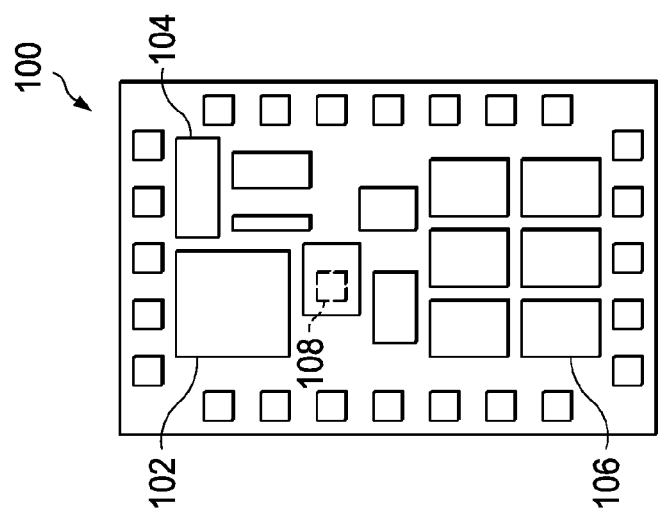

For the purposes of this invention, circuit block is defined as any contiguous subset of components and interconnects in an integrated circuit (IC). The instant invention is a test circuit which includes a set of duplicated circuit blocks from an IC. FIGS. 1A through 1C depict an IC (100) which contains several functional blocks (102, 104, 106), which may include a central processor unit, an instruction cache, and memory blocks. Circuit block (108) is a contiguous subset of components and interconnects in the IC (100). A layout of circuit block (108), which is modified to allow being linked serially, is depicted as (110). The modification may involve truncating elements which are not needed or joining elements which would otherwise be untestable. The circuit block layout (110) is duplicated multiple times in a layout for a test circuit, which is fabricated on a semiconductor substrate to form a physical test circuit (112) embodying the instant invention. Test circuit (112) includes multiple instances (114) of the circuit block, connected serially by connector elements (116) which link sequential instances of the circuit block. Connection elements (118) for testing the test circuit (112) are connected to a first instance and a last instance of the circuit block.

Figure 2:
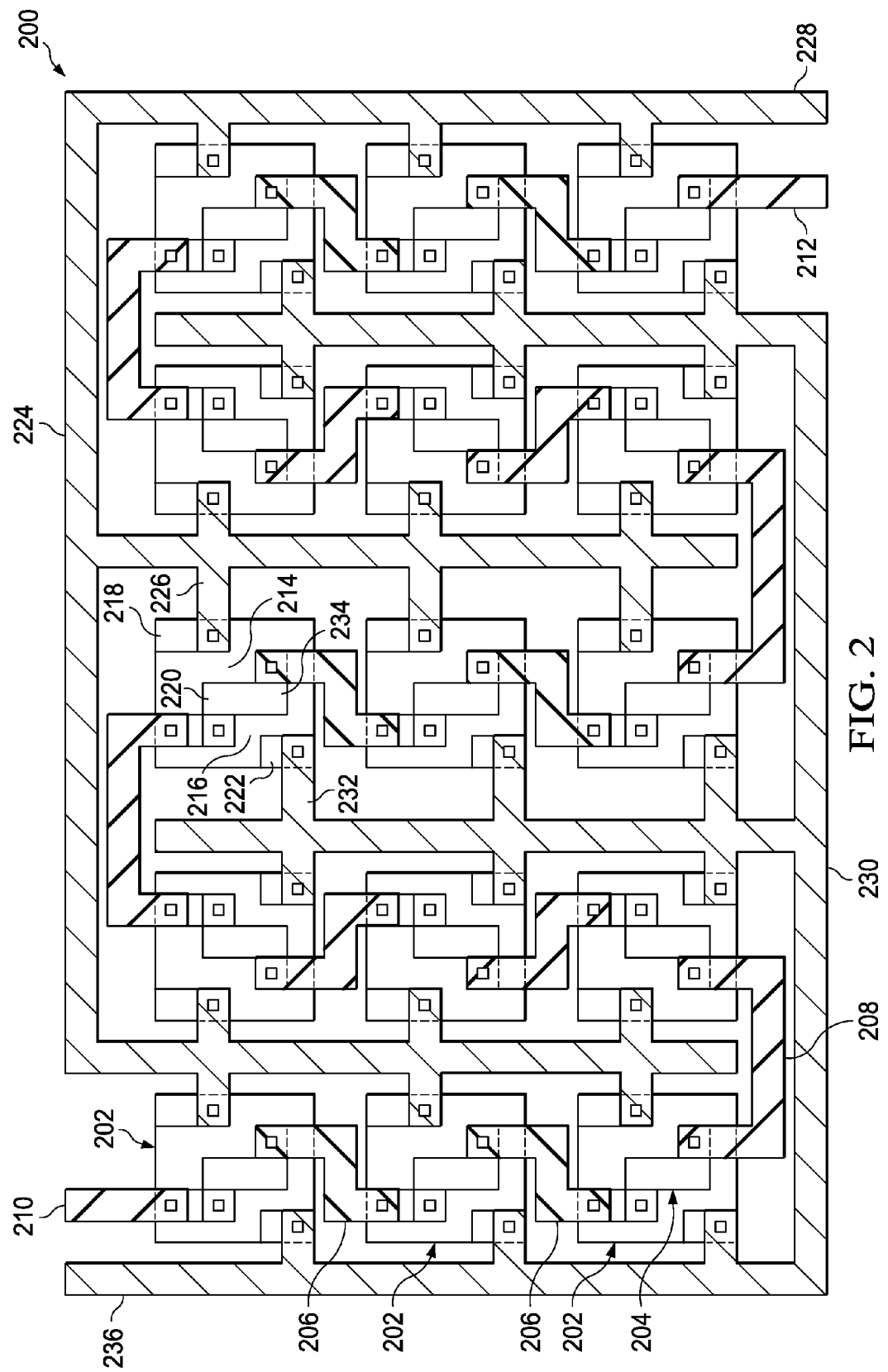
FIG. 2 is a plan view of an interconnect test circuit embodying this invention.

FIG. 2 is a plan view of an interconnect test circuit embodying the instant invention. A test circuit (200) includes circuit blocks (202). Circuit block (202) is modified to allow being linked serially and reproduced multiple times in test circuit (200) for the purpose of defect level assessment. In circuit block (202) are continuity paths (204) of conductive elements, having a first element and a last element, such that passing electrical current from the first element to the last element will result in current flowing through every element in the continuity path. One purpose of test circuit (200) is to assess a level of open circuit defects that cause open circuits in continuity paths (204). Continuity paths (204) are connected in a serial manner by continuity interconnect links (206) and serpentine interconnect links (208), which connect the last element of one instance of the continuity path (204) to the first element of a next continuity path, forming a continuity chain of individual continuity paths. In one embodiment, serpentine interconnect links (208) are in a same interconnect level as the first or last element of the continuity path, and are configured to minimize an electrical resistance of each serpentine interconnect link. It is well known to practitioners of IC fabrication that reproducing a feature of interest multiple times in a test circuit allows assessment of low levels of defect occurrence with a minimum of testing. Measuring electrical resistance from one end (210) of the continuity chain to another end (212) provides an assessment of open circuit defect levels that can be expected to occur in circuit block (202) as implemented in a commercial IC.

Still referring to FIG. 2, circuit block (202) also contains isolation features (214, 216), which separate conductors (218, 220, 222) in interconnects. Another purpose of test circuit (200) is to assess a level of defects that cause short circuits in isolation features (214, 216). Conductor (218) on one side of isolation feature (214) is electrically connected to top parallel isolation bus conductor (224) by link (226). Conductor (220) on another side of isolation feature (214) is part of, or connected to, continuity path (204). In a correctly fabricated circuit block (202), conductor (218) and conductor (220) are electrically isolated. Link (226) is reproduced to connect all instances of conductor (218) to top parallel isolation bus conductor (224). Top parallel isolation bus conductor (224) and the continuity chain are configured so as to form a parallel isolation test circuit for isolation features (214). In an embodiment, link (226) is configured to minimize any impact on formation of isolation feature (214) and conductor (218). Measuring electrical isolation from either end (210, 212) of the continuity chain to an end terminal (228) of top parallel isolation bus conductor (212) provides an assessment of short circuit defect levels that can be expected to occur in feature (214) as implemented in circuit block (202) in a commercial IC.

Still referring to FIG. 2, in a similar manner, conductors (222) adjacent to isolation features (216) are electrically connected to bottom parallel isolation bus conductor (230) by links (232) in every instance of circuit block (202), and conductors (234) also adjacent to isolation features (216), but opposite conductors (222), are part of, or connected to, continuity path (204). In a correctly fabricated circuit block (202), conductor (222) and conductor (234) are electrically isolated. Bottom parallel isolation bus conductor (230) with conductors (222) and links (232), and continuity paths (204) and links (206) are configured to form a parallel test circuit for isolation features (216). Measuring electrical isolation from either end (210, 212) of the continuity chain to an end terminal (236) of bottom parallel isolation bus conductor (230) provides an assessment of short circuit defect levels that can be expected to occur in feature (216) as implemented in circuit block (202) in a commercial IC.

It will be recognized by practitioners of IC fabrication that more than one isolation feature in a circuit block can be tested using one parallel isolation bus conductor, by connecting conductors adjacent to each isolation feature to the parallel isolation bus conductor.

Such embodiment is advantageous compared to conventional line-space interconnect test circuits because it enables a more realistic assessment of defect levels for the circuit block as implemented in a commercial IC. In view of the fact that many circuit blocks are used in a plurality of IC designs, a more realistic assessment of defect levels for such circuit block may provide significant benefits for a fabricator of ICs.

Figure 3:
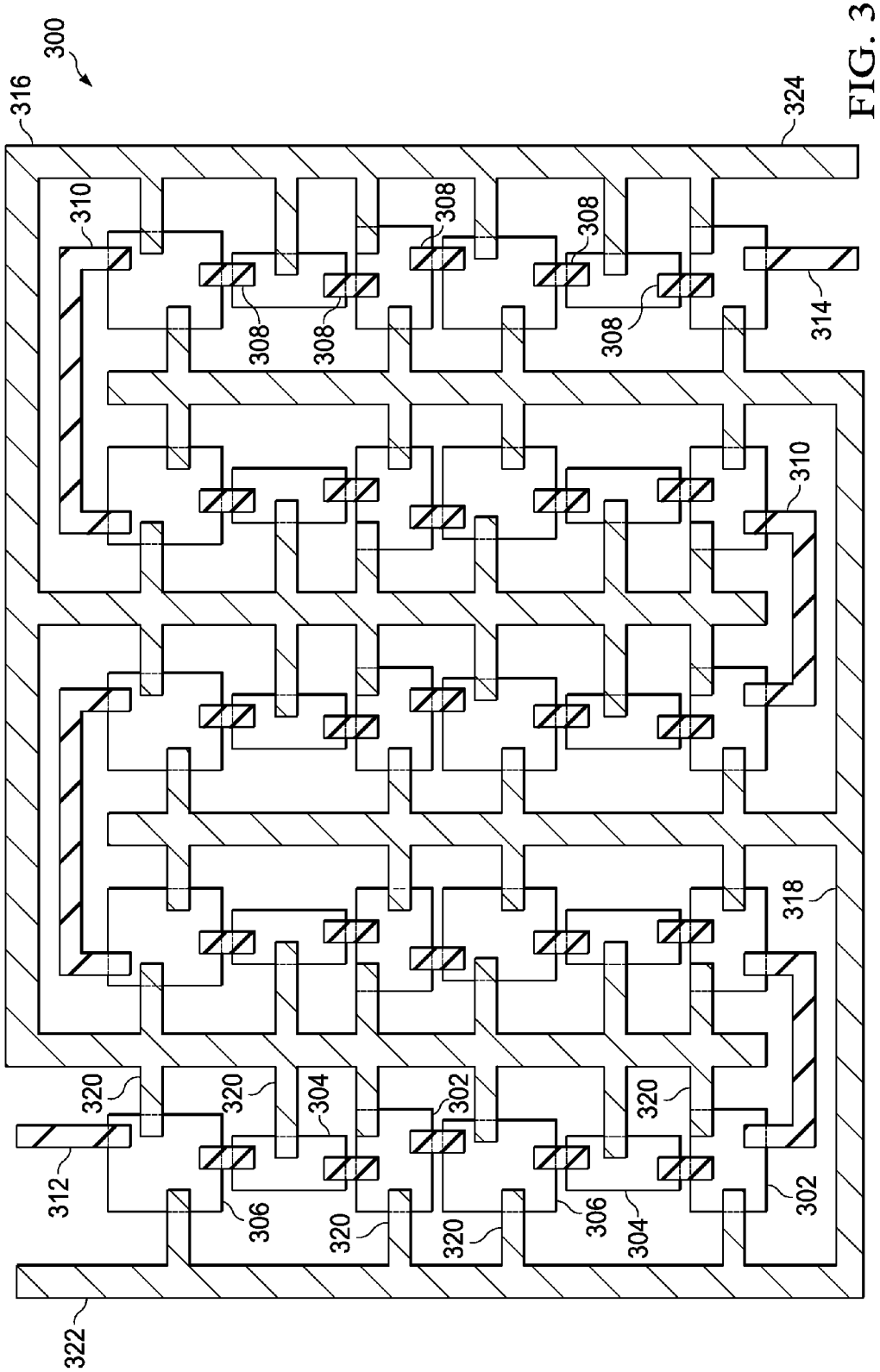
FIG. 3 is a plan view of an interconnect test circuit embodying the instant invention with multiple types of cells.

FIG. 3 is a plan view of an interconnect test circuit embodying the instant invention with multiple types of cells. Test circuit (300) includes a plurality of instances of three types of circuit blocks, a first type (302), a second type (304), and a third type (306). In each circuit block is a continuity path; continuity paths are connected in a serial manner by continuity interconnect links (308) and serpentine interconnect links (310) to form a continuity chain. Measuring electrical resistance from one end (312) of the continuity chain to another end (314) provides an assessment of open circuit defect levels that can be expected to occur in circuit blocks (302, 304, 306) as implemented in a commercial IC.

Still referring to FIG. 3, each type of circuit block (302, 304, 306) may include isolation features, as described above. Conductors adjacent to isolation features are electrically connected to top parallel isolation bus conductor (316) or bottom parallel isolation bus conductor (318) by links (320). Top parallel isolation bus conductor (316), bottom parallel isolation bus conductor (318) and the continuity chain are configured to form a parallel test circuit for isolation features, including, but not limited to a comb-serpent configuration, in which top parallel isolation bus conductor (316) and bottom parallel isolation bus conductor (318) are configured as interleaved combs, and the continuity chain is arranged between teeth of each comb in a serpentine configuration. Measuring electrical isolation from either end (312, 314) of the continuity chain to an end terminal (322) of bottom parallel isolation bus conductor (318) and to an end terminal (324) of top parallel isolation bus conductor (316) provides an assessment of short circuit defect levels that can be expected to occur in circuit blocks (302, 304, 306) as implemented in a commercial IC.

It will be recognized by practitioners of IC fabrication that fewer or more than three types of circuit blocks can be implemented in this embodiment. Combining circuit blocks in test circuits is advantageous because it enables assessments of defect levels for a plurality of circuit blocks with minimal testing.

Figure 4:
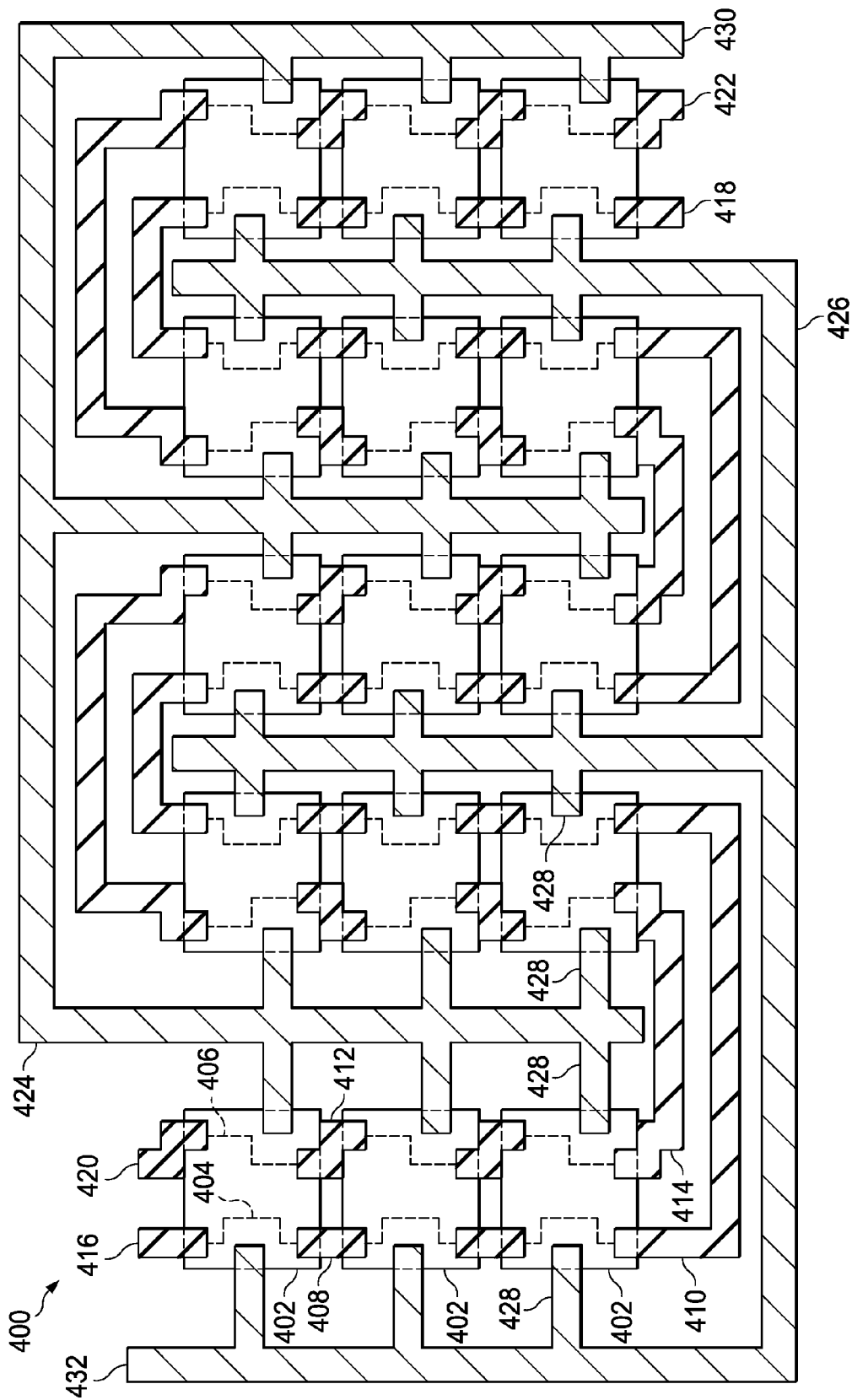
FIG. 4 is a plan view of an interconnect test circuit embodying the instant invention with multiple continuity paths.

FIG. 4 is a plan view of an interconnect test circuit embodying the instant invention with multiple continuity paths. A test circuit (400) includes a circuit block (402) of interest from commercial ICs. Circuit block (402) is reproduced multiple times in test circuit (400) for the purpose of defect level assessment. In circuit block (402) are a first continuity path (404), a second continuity path (406), and possibly more continuity paths. Each continuity path is electrically isolated from all other continuity paths in the circuit block (400). A purpose of test circuit (400) is to assess a level of defects that cause open circuits in each continuity path (404, 406). Instances of the first continuity path (404) are connected in a serial manner by a first continuity interconnect link (408) and a first serpentine interconnect link (410), forming a first continuity chain. In a similar manner, instances of the second continuity path (406) are connected in a serial manner by a second continuity interconnect link (412) and a second serpentine interconnect link (414), forming a second continuity chain. Additional continuity paths may be connected in series as described above to form additional continuity chains. Measuring electrical resistance from one end (416) of the first continuity chain to another end (418) of the same chain provides an assessment of open circuit defect levels in the first continuity path that can be expected to occur in circuit blocks (402) as implemented in a commercial IC. Similarly, measuring electrical resistance from one end (420) of the second continuity chain to another end (422) of the same chain provides an assessment of open circuit defect levels in the second continuity path that can be expected to occur in circuit blocks (402) as implemented in a commercial IC. Additional continuity chains, referred to above, may be tested in a similar manner to provide assessments of open circuit defect levels in the corresponding additional continuity paths.

Still referring to FIG. 4, circuit block (402) may include isolation features, as described above. Conductors adjacent to isolation features are electrically connected to top parallel isolation bus conductor (424) or bottom parallel isolation bus conductor (426) by links (428). Top parallel isolation bus conductor (424), bottom parallel isolation bus conductor (426) and the continuity chains are configured to form a parallel test circuit for isolation features. Measuring electrical isolation from either end (416, 418) of the first continuity chain, and from either end (420, 422) of the second continuity chain, to an end terminal (430) of top parallel isolation bus conductor (424) and to an end terminal (432) of bottom parallel isolation bus conductor (426) provides an assessment of short circuit defect levels that can be expected to occur in circuit blocks (402) as implemented in a commercial IC.

It will be recognized by practitioners of IC fabrication that more than two types of continuity paths can be implemented in this embodiment. Configuring more than one continuity chain in a test circuit is advantageous because it enables assessments of defect levels for a plurality of continuity paths with minimal testing and more efficient utilization of test circuit space.

Figure 5:
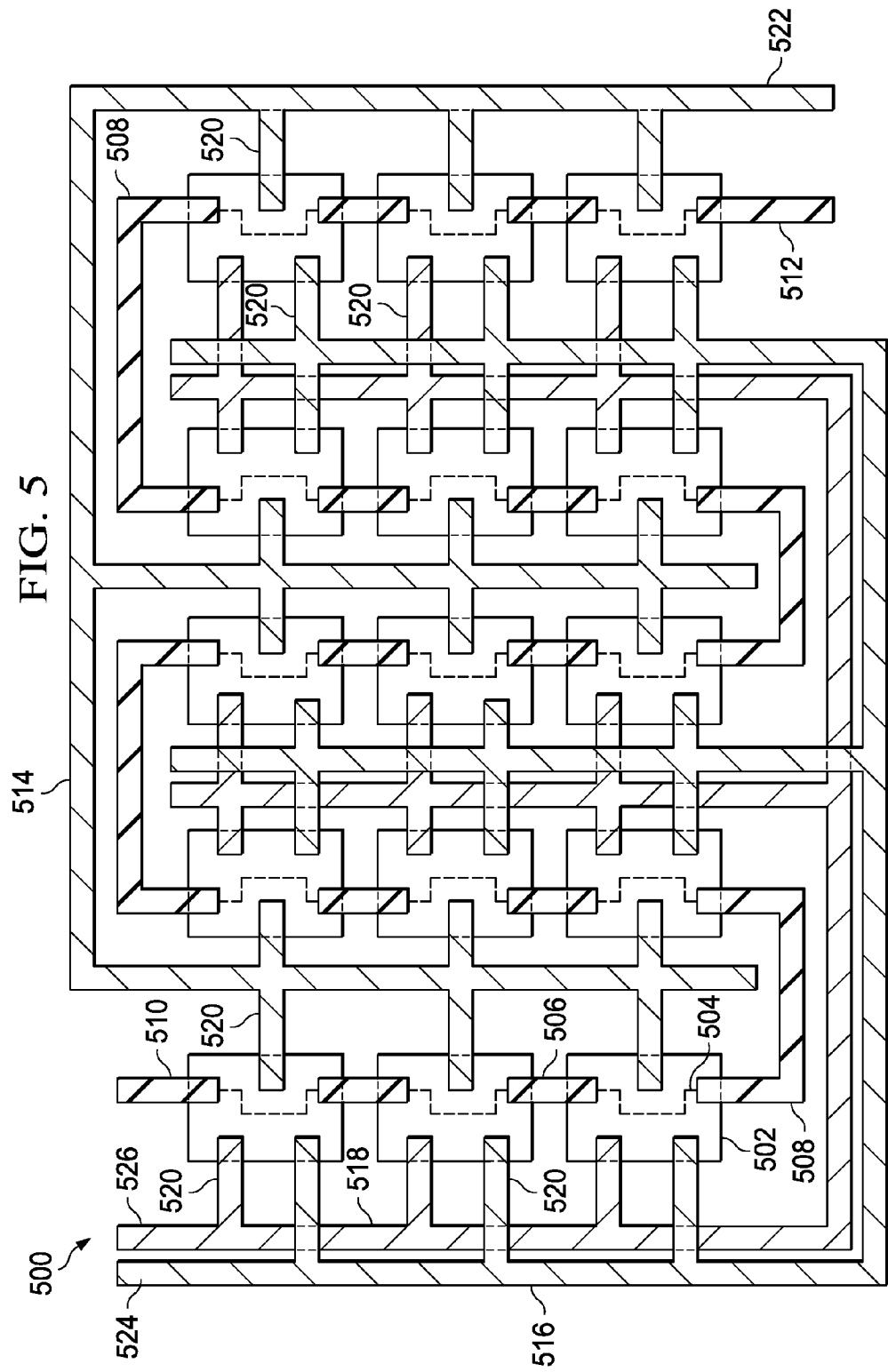
FIG. 5 is a plan view of an interconnect test circuit embodying the instant invention with multiple combs.

FIG. 5 is a plan view of an interconnect test circuit embodying the instant invention with multiple combs. A test circuit (500) includes a circuit block (502) of interest from commercial ICs. Circuit block (502) is reproduced multiple times in test circuit (500) for the purpose of defect level assessment. In circuit block (502) is a continuity path (504). Instances of the continuity path (504) are connected in a serial manner by a continuity interconnect link (506) and a serpentine interconnect link (508), forming a continuity chain. As in previous embodiments, measuring electrical resistance from one end (510) of the first continuity chain to another end (512) of the same chain provides an assessment of open circuit defect levels in the first continuity path that can be expected to occur in circuit blocks (502) as implemented in a commercial IC.

Still referring to FIG. 5, circuit block (502) includes isolation features, as described above. In this embodiment, more than two parallel isolation bus conductors are included. Conductors adjacent to isolation features are electrically connected to top parallel isolation bus conductor (514) or a first bottom parallel isolation bus conductor (516) or a second bottom parallel isolation bus conductor (518) by interconnect links (520). Top parallel isolation bus conductor (514), bottom parallel isolation bus conductors (516, 518) and said continuity chain are configured to form a parallel test circuit for isolation features. Measuring electrical isolation from either end (510, 512) of said continuity chain to an end terminal (522) of top parallel isolation bus conductor (514), to an end terminal (524) of first bottom parallel isolation bus conductor (516) and to an end terminal (526) of second bottom parallel isolation bus conductor (518) provides an assessment of short circuit defect levels that can be expected to occur in circuit blocks (502) as implemented in a commercial IC.

It will be recognized by practitioners of IC fabrication that more than two parallel isolation bus conductors can be implemented in this embodiment. Configuring more than two parallel isolation bus conductors in a test circuit is advantageous because it enables assessments of defect levels for a plurality of isolation features with minimal testing and more efficient utilization of test circuit space.

FIGS. 6A through FIG. 6D are views of an interconnect test circuit embodying the instant invention showing high level metal connections to combs, before and after removal of the high level metal. Any of the embodiments discussed above may be improved by configuring the links connecting conductors adjacent to isolation features to parallel isolation bus conductors on a metal level higher than any metal levels of interest in the circuit blocks and higher than said links connecting continuity paths. Equivalent elements in FIGS. 6A through 6D are assigned the same reference numbers, to assist reading the disclosure.

Figure 6A:
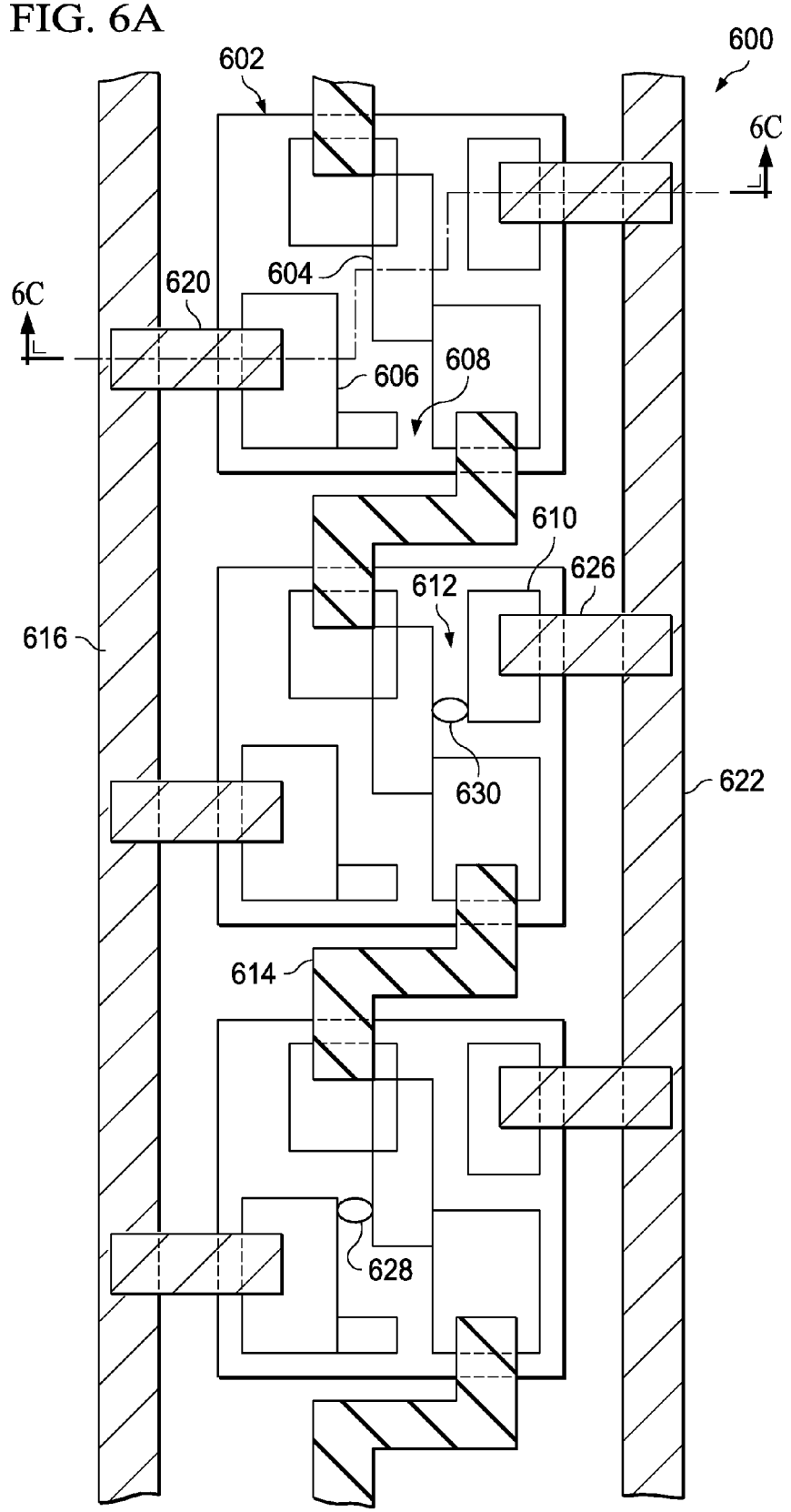
FIGS. 6A and 6B are plan views of an interconnect test circuit embodying the instant invention showing high level metal connections to combs, before and after removal of the high level metal.
Figure 6B:
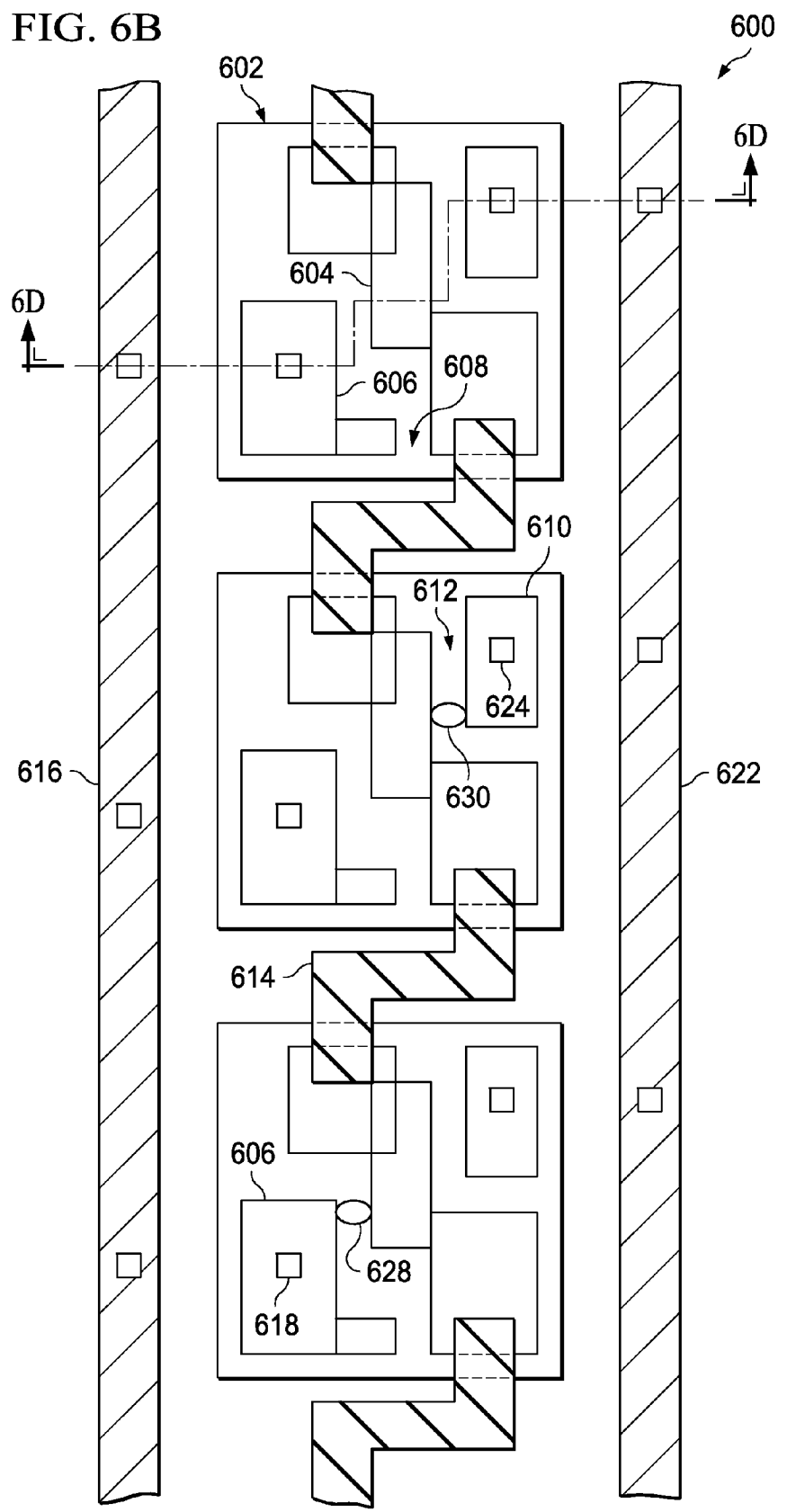

FIG. 6A and FIG. 6B are plan views of an interconnect test circuit embodying the instant invention showing high level metal connections to combs, before and after removal of said high level metal, respectively. Test circuit (600) includes multiple placements of a circuit block (602). In each circuit block (602) is a continuity path (604), a first conductor (606) adjacent to a first isolation feature (608) and a second conductor (610) adjacent to a second isolation feature (612). Instances of continuity path (604) are connected in a serial manner by continuity interconnect links (614) to form a continuity chain. First conductor (606) adjacent to first isolation feature (608) is connected to a first parallel isolation bus conductor (616) by a first intermediate link (618) and a first top link (620), whereby first top link (620) is on a metal level higher than any features of interest in circuit block (602) and higher than continuity chain link (614). Similarly, second conductor (610) adjacent to second isolation feature (612) is connected to a second parallel isolation bus conductor (622) by a second intermediate link (624) and a second top link (626), whereby second top link (626) is on a metal level higher than any features of interest in circuit block (602) and higher than continuity chain link (614). A first short circuit defect (628) electrically connects one instance of first conductor (606) adjacent to an instance of first isolation feature (608) to one instance of continuity path (604). Similarly, a second short circuit defect (630) electrically connects one instance of second conductor (610) adjacent to an instance of second isolation feature (612) to one instance of continuity path (604). First and second short circuit defects (628, 630) are detectable by measuring electrical isolation between said continuity chain and first and second parallel isolation bus conductors (616, 622), in the circuit configuration depicted in FIG. 6A. It is difficult to locate short circuit defects among the multitude of potential failure sites in a test circuit as depicted in FIG. 6A, wherein all conductors adjacent to isolation features are connected to parallel isolation bus conductors. Removing connections between conductors adjacent to isolation features and parallel isolation bus conductors, as depicted in FIG. 6B, allows users to locate short circuit defects using a voltage contrast analysis in a scanning electron microscope. The removal of connections between conductors adjacent to isolation features and parallel isolation bus conductors may be accomplished by several techniques. One technique is to remove successive layers of said test circuit, starting with the top layer, until said connections between conductors adjacent to isolation features and parallel isolation bus conductors are severed, and metal layers with features of interest in said circuit blocks and said continuity interconnect links remain undisturbed.

Figure 6C:
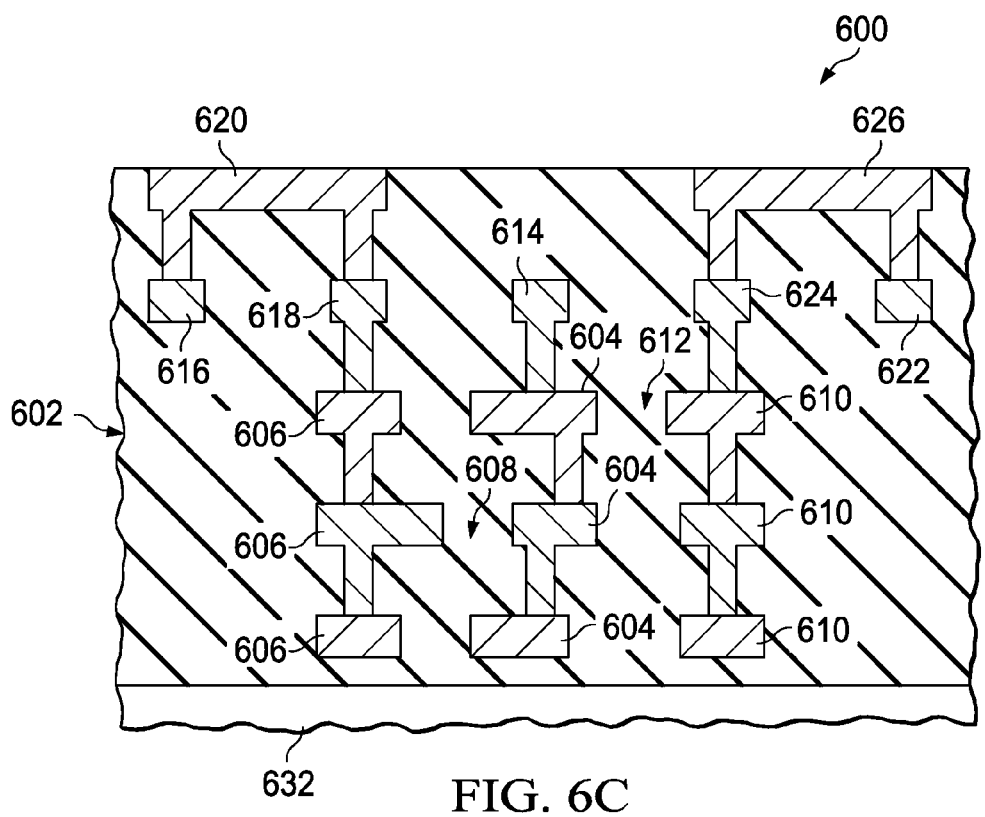
FIGS. 6C and 6D are section views taken along the lines 6C-6C and 6D-6D of FIGS. 6A and 6B, respectively.
Figure 6D:
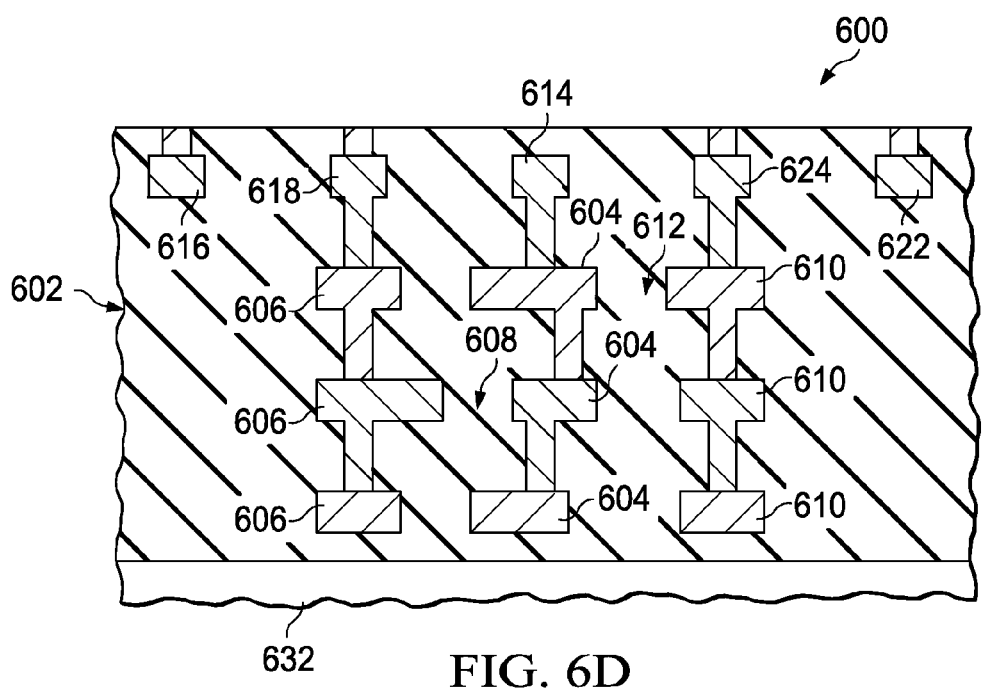

FIG. 6C and FIG. 6D depict cross-sections of a portion of said test circuit embodying the instant invention showing high level metal connections to combs, before and after removal of said high level metal, respectively. Referring to FIG. 6C, a test circuit (600) includes a substrate (632), a continuity path (604) of the type discussed above, a first conductor (606) adjacent to a first isolation feature (608), as discussed above, and a second conductor (610) adjacent to a second isolation feature (612). As in previous embodiments, conductors adjacent to isolation features are electrically isolated from continuity paths, unless connected by a defect. Continuity path (604) is connected to similar continuity paths in other placements of circuit block (602) by interconnect link (614) to form a continuity chain, as discussed above. First conductor (606) adjacent to first isolation feature (608) is connected to a parallel isolation bus conductor (616) by an intermediate link (618) and a first top link (620), whereby first top link (620) is on a metal level higher than any features of interest in circuit block (602) and higher than continuity chain link (614). Similarly, second conductor (610) adjacent to second isolation feature (612) is connected to a parallel isolation bus conductor (622) by an intermediate link (624) and a second top link (626), whereby second link (626) is on a metal level higher than any features of interest in circuit block (602) and higher than continuity chain link (614).

FIG. 6D depicts the test circuit discussed above in reference to FIG. 6C, wherein the test circuit has been partially deprocessed to remove the metal level containing first and second top links (620, 626) between conductors adjacent to isolation structures and parallel isolation bus conductors, and leave intact metal levels containing all features of interest in circuit block (602) and continuity path links (614). After said deprocessing, instances of conductors (606, 610) which are electrically connected to said continuity chain by defects, as discussed above, as easily located by a voltage contrast analysis in a scanning electron microscope, a known technique to practitioners of IC fabrication. Thus, the instant embodiment of configuring said links connecting conductors adjacent to isolation features to parallel isolation bus conductors on a metal level higher than any metal levels of interest in said circuit blocks and higher than said links connecting continuity paths is advantageous in that it enables users of said test circuit to easily locate defects causing short circuit failures in isolation features.

Practitioners of IC fabrication will recognize that the benefits of the above embodiment are realized if the parallel isolation bus conductors are located on the same metal level as the top links and are removed by deprocessing as described above.

Practitioners of IC fabrication will also recognize the same benefit of locating short circuit defects will be realized on partially fabricated test circuits, which have fabricated interconnect levels up to, but not including, any level containing said top links.

FIGS. 7A through 7D are views of an interconnect test circuit embodying the instant invention with parallel isolation bus conductors that are segmented on a lower level or levels and contiguous on a top level, before and after removal of the high level metal. This embodiment realizes the same benefits of locating short circuit defects as the embodiment discussed in reference to FIGS. 6A through 6D. Equivalent elements in FIGS. 7A through 7D are assigned the same reference numbers, to assist reading the disclosure.

Figure 7A:
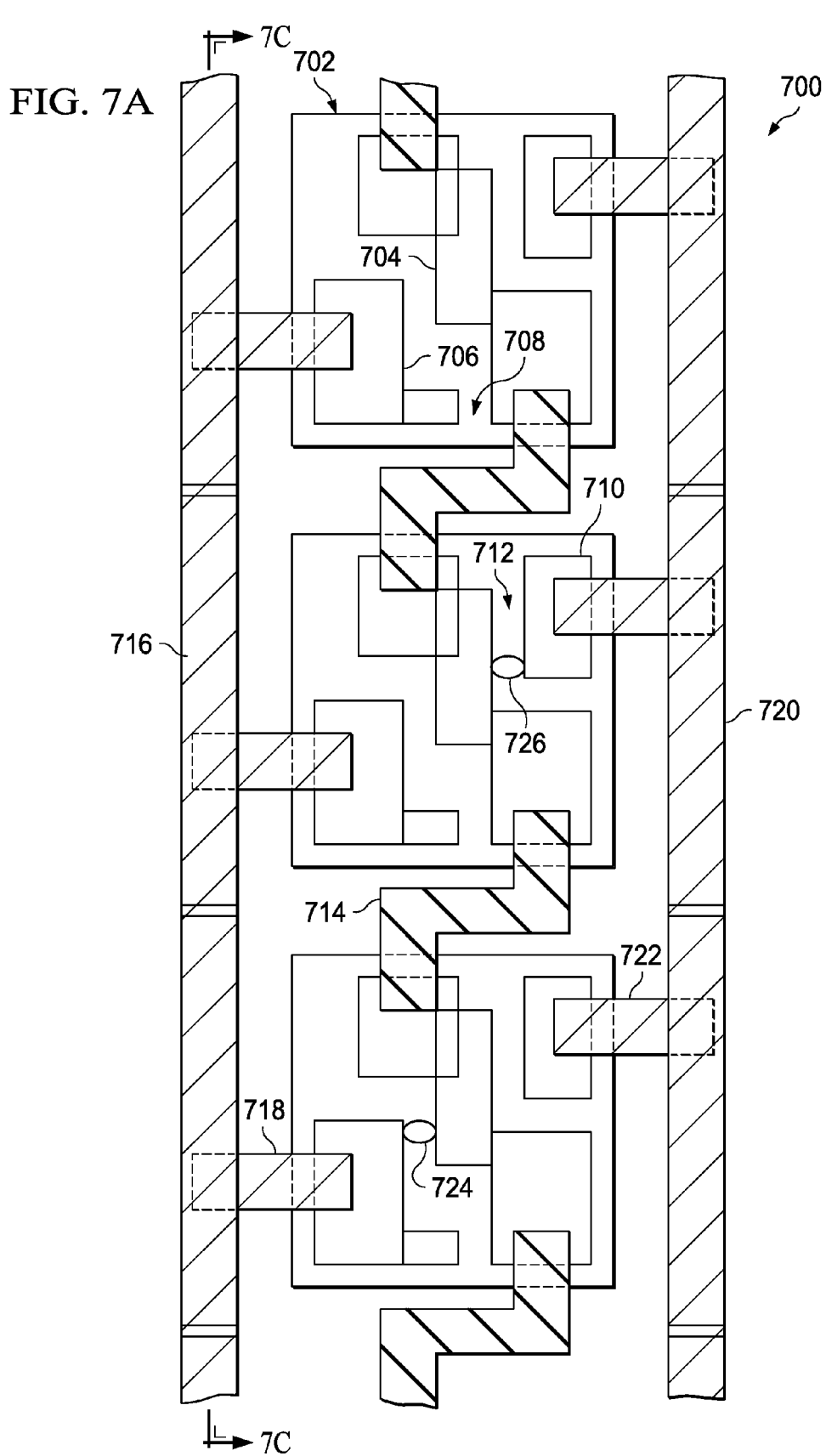
FIGS. 7A and 7B are plan views of an interconnect test circuit embodying the instant invention with parallel isolation bus conductors that are segmented on a lower level or levels and contiguous on a top level, before and after removal of the high level metal.
Figure 7B:
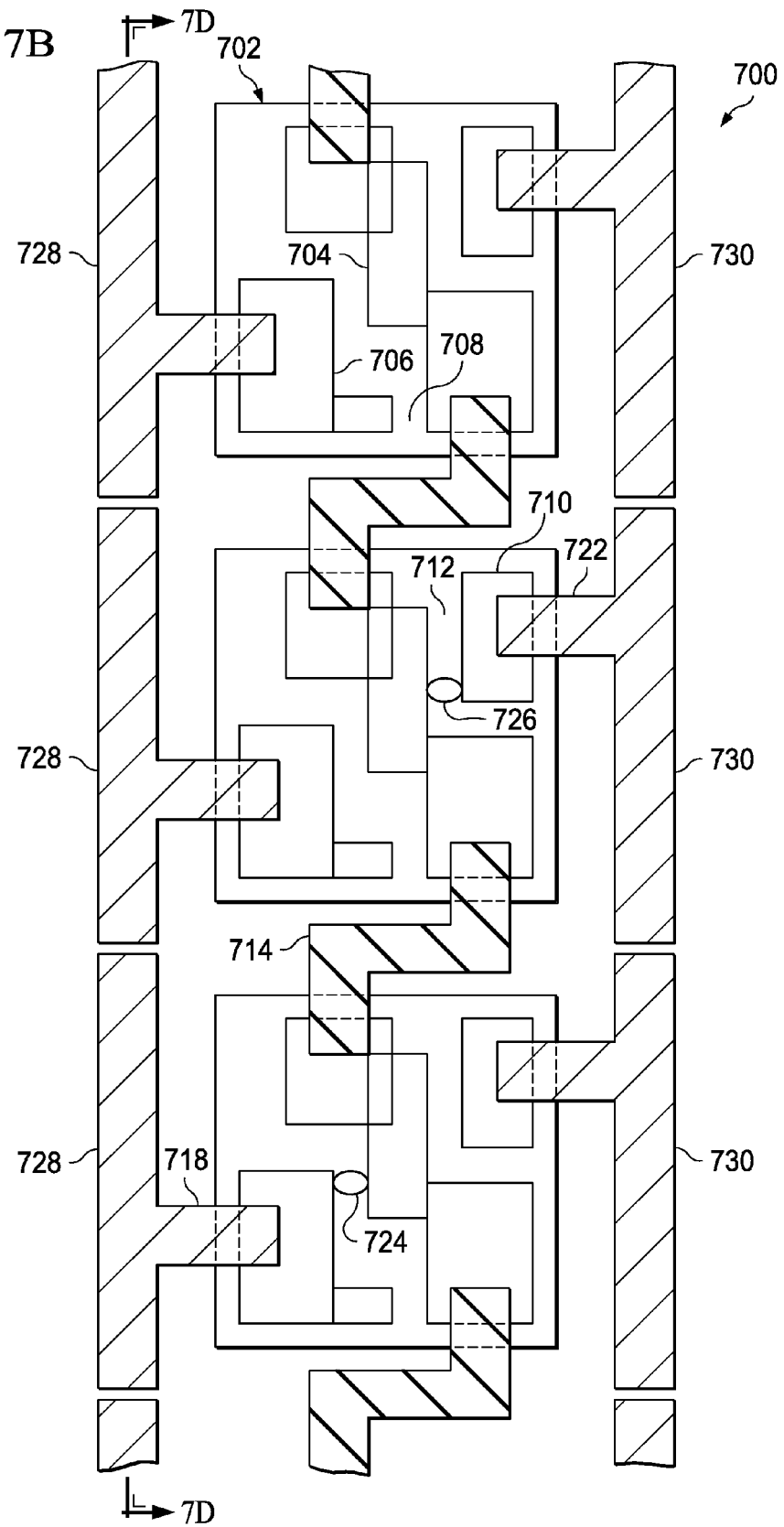

FIGS. 7A and 7B are plan views of an interconnect test circuit embodying the instant invention with parallel isolation bus conductors that are segmented on a lower level or levels, and contiguous on a top level, before and after removal of said top level metal, respectively. Test circuit (700) includes multiple placements of a circuit block (702). In each circuit block (702) is a continuity path (704), a first conductor (706) adjacent to a first isolation feature (708) and a second conductor (710) adjacent to a second isolation feature (712). Instances of continuity path (704) are connected in a serial manner by continuity interconnect links (714) to form a continuity chain. First conductor (706) adjacent to first isolation feature (708) is connected to a first parallel isolation bus conductor (716) by a first parallel isolation link (718) which is on an interconnect level lower than the first parallel isolation bus conductor (716). Similarly, second conductor (710) adjacent to second isolation feature (712) is connected to a second parallel isolation bus conductor (720) by a second parallel isolation link (722) which is on an interconnect level lower than the first parallel isolation bus conductor (720). A first short circuit defect (724) electrically connects one instance of first conductor (706) adjacent to an instance of first isolation feature (708) to one instance of continuity path (704). Similarly, a second short circuit defect (726) electrically connects one instance of second conductor (710) adjacent to an instance of second isolation feature (712) to one instance of continuity path (704). First and second short circuit defects (724, 726) are detectable by measuring electrical isolation between said continuity chain and first and second parallel isolation bus conductors (716, 720), in the circuit configuration depicted in FIG. 7A. It is difficult to locate short circuit defects among the multitude of potential failure sites in a test circuit as depicted in FIG. 7A, wherein all conductors adjacent to isolation features are connected to parallel isolation bus conductors. Severing connections between conductors adjacent to isolation features and parallel isolation bus conductors, as depicted in FIG. 7B, allows users to locate short circuit defects using a voltage contrast analysis in a scanning electron microscope. The severing of connections between conductors adjacent to isolation features and parallel isolation bus conductors is accomplished by removing a top level of parallel isolation bus conductors (716, 720), leaving first and second parallel isolation bus segments (728, 730). A procedure for said removal is to remove successive layers of said test circuit, known as deprocessing, starting with the top layer, until said top level of parallel isolation bus conductors (716, 720) are removed, and metal layers with features of interest in said circuit blocks and said first and second parallel isolation bus segments (728, 730) remain undisturbed.

Figure 7C:
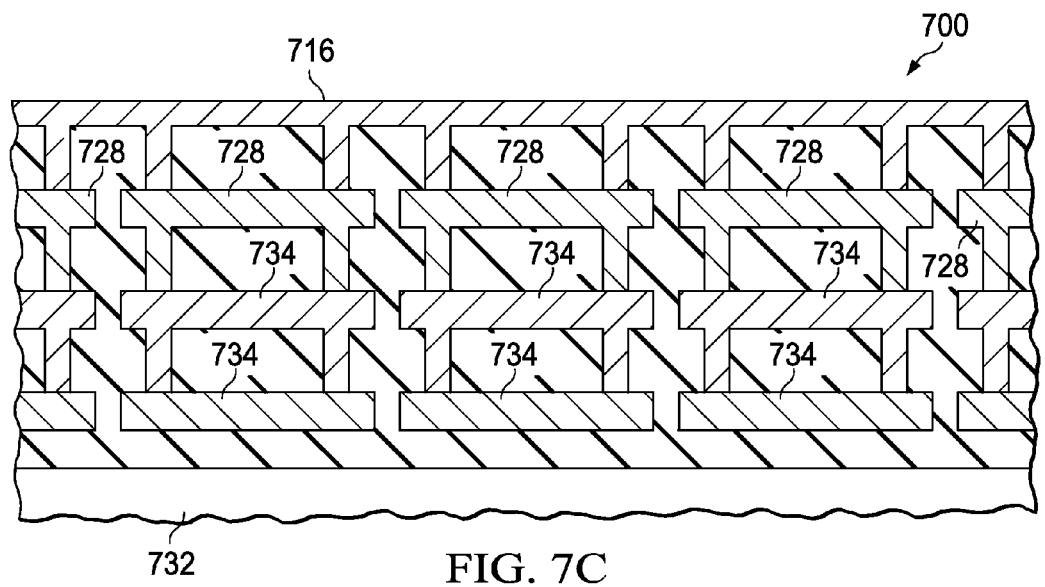
FIGS. 7C and 7D are section views taken along the lines 7C-7C and 7D-7D of FIGS. 7A and 7B, respectively.
Figure 7D:
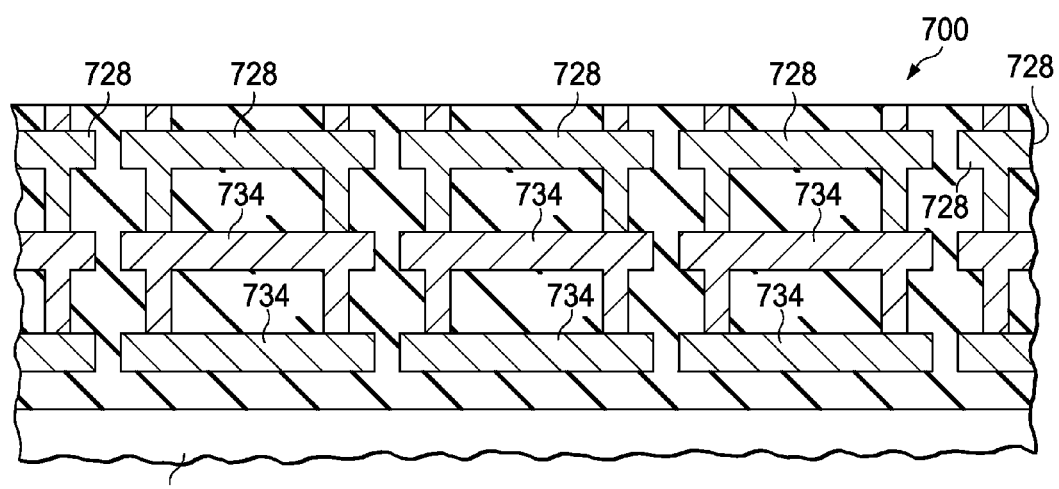

FIGS. 7C and 7D depict cross-sections of a portion of said test circuit embodying the instant invention with parallel isolation bus conductors that are segmented on a lower level or levels, and contiguous on a top level, before and after removal of said top level metal, respectively. Referring to FIG. 7C, a test circuit (700) includes a substrate (732), parallel isolation bus conductor (716), and parallel isolation bus segments (728) which may include elements at lower interconnect levels (734), whereby parallel isolation bus conductor (716) is on a metal level higher than any features of interest in said circuit block and higher than said continuity chain link, and said parallel isolation links are on a same interconnect level as parallel isolation bus segments (728).

FIG. 7D depicts the test circuit discussed above in reference to FIG. 7C, wherein the test circuit has been partially deprocessed to remove the metal level containing parallel isolation bus conductor (716), leaving intact metal levels containing parallel isolation bus segments (728) and segment elements at lower interconnect levels (734). After said deprocessing, instances of conductors which are electrically connected to said continuity chain by defects, as discussed above, as easily located by a voltage contrast analysis in a scanning electron microscope, a known technique to practitioners of IC fabrication. Thus, the instant embodiment of configuring said parallel isolation buses as contiguous conductors on a metal level higher than any metal levels of interest in said circuit blocks and higher than said links connecting continuity paths, and segmented conductors on lower interconnect levels connected to conductors adjacent to isolation features is advantageous in that it enables users of said test circuit to easily locate defects causing short circuit failures in isolation features. This embodiment is similar to that discussed in reference to FIGS. 6A through 6D, with the comparative advantage that shorted small conductors adjacent to isolation features are easier to identify by virtue of the larger conductor segment to which they remain connected.

Practitioners of interconnect fabrication will also recognize the same benefit of locating short circuit defects will be realized on partially fabricated test circuits, which have fabricated interconnect levels up to, but not including, any level containing said parallel isolation bus conductor (716).

The test circuit may be included in an integrated circuit having a plurality of components formed in a substrate and a plurality of interconnects connected to the components. Such integrated circuit may, for example, include field oxide regions, n-wells, and p-wells in the substrate. N-channel MOS transistors in a p-well may each include a first gate dielectric on a top surface of the p-well, a first gate structure on a top surface of the first gate dielectric, n-type source and drain regions in the p-well adjacent to the first gate structure, and a first set of silicide regions on, and in contact with, top surfaces of the n-type source and drain regions. P-channel MOS transistors in an n-well may each include a second gate dielectric on a top surface of the n-well, a second gate structure on a top surface of the second gate dielectric, p-type source and drain regions in the n-well adjacent to the second gate structure, and a second set of silicide regions on, and in contact with, top surfaces of the p-type source and drain regions. Also included may be a pre-metal dielectric layer stack on the n-channel transistors and the p-channel transistors; contacts in the pre-metal dielectric layer stack on, and electrically connected to, the n-type source and drain regions and the p-type source and drain regions; a first intra-metal dielectric layer on the pre-metal dielectric layer stack; a first set of metal interconnect structures in the first intra-metal dielectric layer; a first inter-level dielectric layer on the first set of metal interconnect structures; a first set of metal vias in the first inter-level dielectric layer, whereby metal vias in the first set of metal vias contact metal interconnect structures in the first set of metal interconnect structures; and a second set of metal interconnect structures in the first inter-level dielectric layer, whereby metal interconnect structures in the second set of metal interconnect structures contact and overlap metal vias in the first set of metal vias.

Providing an assessment of the open circuit defect levels through measurement of electrical resistance of the continuity test chain may, for example, be done as follows: recording a number of times the step of measuring a first electrical resistance was executed; counting a number of instances of the first electrical resistance measurement which exceed a threshold value; and assigning a defect level value to the number of instances that the first electrical resistance measurement exceeds the threshold value divided by a product of the number of times the first electrical resistance measurement was executed, times an area of the test circuit. A similar procedure may be followed for a second continuity test chain: measuring a second electrical resistance of instances of the second continuity test chain; recording the number of times the step of measuring the second electrical resistance was executed; counting the number of instances of the second electrical resistance measurement which exceed a second threshold value; and assigning a second defect level value to the number of instances that the second electrical resistance measurement which exceed the second threshold value divided by a product of the number of times the second electrical resistance measurement was executed, times an area of the test circuit.

Assessment of the short circuit defect levels may be done providing a parallel conductive element adjacent to the plurality of instances of the circuit block to form an isolation test structure: measuring a third electrical resistance of instances of the isolation test structure; recording the number of times the step of measuring the third electrical resistance was executed; counting the number of instances of the third electrical resistance measurement which are below a third threshold value; and assigning a third defect level value to the number of instances of the third electrical resistance measurement which are below the third threshold value divided by a product of the number of times the third electrical resistance measurement was executed, times an area of the test circuit. A similar procedure may be followed also for a second parallel conductive element provided adjacent to the plurality of instances of the circuit block to form a second isolation test structure: measuring a fourth electrical resistance of instances of the second isolation test structure; recording the number of times the step of measuring the fourth electrical resistance was executed; counting the number of instances of the fourth electrical resistance measurement which are below a fourth threshold value; and assigning a fourth defect level value to the number of instances of the fourth electrical resistance measurement which are below the fourth threshold value divided by a product of the number of times the fourth electrical resistance measurement was executed, times an area of the test circuit.

What is claimed is:

1. A method of testing functional circuit blocks of an integrated circuit, the functional circuit blocks having circuit components fabricated in surface layers of a semiconductor substrate and metal interconnects fabricated in layers above the substrate; the method comprising:
   providing IC functional circuit blocks in modified form with respective continuity paths of conductive elements having first elements and last elements, such that passing electrical current from the first element to the last element will result in current flowing through every element in the continuity path; and also including respective isolation features which separate the conductive elements of the interconnects; and providing a test structure having:
- test circuit blocks comprising sets of multiple duplicate instances of the modified functional circuit blocks including duplications of the continuity paths and isolation features;
- continuity interconnect links and serpentine interconnect links connecting the duplicated continuity paths of the respective duplicated blocks in a serial manner with the last element of the continuity path of one duplicated block being connected to a first element of the continuity path of a next duplicated block, thereby forming a continuity chain of the individual continuity paths of the duplicated blocks;
- a first parallel isolation bus conductor electrically connected to first conductive elements on first sides of the duplicated isolation features; and
- a second parallel isolation bus conductor electrically connected to second conductive elements on second sides of the duplicated isolation features, electrically isolated from the first conductive elements; the first and second parallel isolation buses defining a parallel isolation test circuit for the isolation features;

measuring electrical resistance between ends of the continuity chain to provide an assessment of a level of open circuit defects that can be expected to occur in the functional circuit blocks in the integrated circuit; and measuring electrical isolation between terminals of the first parallel isolation bus conductor and the second parallel isolation bus conductor to provide an assessment of a level of short circuit defects that can be expected to occur in the functional circuit blocks in the integrated circuit.

2. The method of claim 1,
wherein the second parallel isolation bus conductor is provided in at least a portion of the continuity chain; and
wherein measuring the electrical isolation includes measuring electrical isolation between either end of the continuity chain and the terminal of the first parallel isolation bus conductor provides the assessment of the level of short circuit defects.

3. The method of claim 2,
wherein the modified functional circuit blocks are provided further including respective second isolation features which separate the conductive elements of the interconnects;
wherein the test circuit blocks are provided further including duplications of the second isolation features;
wherein the second parallel isolation bus conductor is provided electrically connected to third conductive elements on one or first or second sides of the duplicated second isolation features;
wherein the test structure is provided further including a third parallel isolation bus conductor electrically connected to fourth conductive elements on the other of first or second sides of the duplicated second isolation features; the second and third parallel isolation buses defining a second parallel isolation test circuit for the second isolation features;
wherein measuring the electrical isolation between either end of the continuity chain and the terminal of the first parallel isolation bus conductor provides the assessment of the level of short circuit defects that can be expected to occur in the functional circuit blocks for the first isolation features; and
wherein measuring the electrical isolation further includes measuring the electrical isolation between either end of the continuity chain and a terminal of the third parallel isolation bus conductor to provide an assessment of the level of short circuit defects that can be expected to occur in the functional circuit blocks for the second isolation features.

4. The method of claim 1,
wherein the test structure is provided further including interconnect links formed between the first or second conductive elements and the first or second parallel isolation bus conductor formed on a highest metal level; and
further comprising using voltage contrast analysis to identify test circuit blocks with short circuit defects among the placements of all the test circuit blocks.

5. The method of claim 1,
wherein the functional circuit blocks are provided further including respective additional continuity paths;
wherein the test circuit blocks are provided further including duplications of the additional continuity paths; and
wherein the test structure is provided further including additional continuity interconnect links and additional serpentine interconnect links connecting the duplicated additional continuity paths in a serial manner, thereby forming additional continuity chains of the individual additional continuity paths; and
whereby measuring the electrical resistance further includes measuring the electrical resistance between ends of the additional continuity chains to provide an assessment of a level of open circuit defects that can be expected to occur in the functional circuit blocks for the additional continuity paths.

* * * * *